(12) United States Patent
Platz

(10) Patent No.: US 6,881,291 B2
(45) Date of Patent: Apr. 19, 2005

(54) PROCESS FOR BONDING CONDUCTOR TRACKS TO PLASTICS SURFACES

(75) Inventor: Reinhold Platz, Osnabrück (DE)

(73) Assignee: Ticona GmbH (DE)

( * ) Notice: Subject to any disclaimer, the term of this patent is extended or adjusted under 35 U.S.C. 154(b) by 265 days.

(21) Appl. No.: 10/156,601

(22) Filed: May 28, 2002

(65) Prior Publication Data

US 2002/0179234 A1 Dec. 5, 2002

(30) Foreign Application Priority Data

May 25, 2001 (DE) ......................... 101 25 570

(51) Int. Cl.$^7$ ............................... H05K 3/10
(52) U.S. Cl. ................ 156/272.8; 156/309.9; 156/322; 29/831; 29/850
(58) Field of Search ............ 156/272.2, 272.8, 156/309.9, 322; 29/831, 846, 850; 219/121.6, 121.63, 121.64

(56) References Cited

U.S. PATENT DOCUMENTS

| | | | | |
|---|---|---|---|---|
| 5,462,773 A | * | 10/1995 | Swift et al. ............... | 427/555 |
| 6,217,695 B1 | * | 4/2001 | Goldberg et al. ......... | 156/244.17 |
| 6,319,564 B1 | * | 11/2001 | Naundorf et al. ......... | 427/531 |
| 6,417,486 B1 | * | 7/2002 | Reil et al. ............... | 219/121.69 |
| 6,521,830 B1 | * | 2/2003 | Platz ....................... | 174/50 |
| 2004/0031562 A1 | * | 2/2004 | Kaiser et al. ............ | 156/272.8 |

FOREIGN PATENT DOCUMENTS

| DE | 3544377 A1 | * | 6/1987 | ........ H01L/21/60 |
|---|---|---|---|---|
| DE | 19944383 A1 | * | 4/2001 | ........ H01Q/1/42 |

* cited by examiner

Primary Examiner—John T. Haran
(74) Attorney, Agent, or Firm—Connolly Bove Lodge & Hutz LLP

(57) ABSTRACT

In the process described, the surfaces of plastics are provided with electrical conductor tracks with the aid of laser beams.

The process permits the production of moldings made from plastic with integrated conductor tracks which are less expensive and can be produced using simple apparatus.

The products of the process may be used in the electrical and electronics industries, for example.

7 Claims, 1 Drawing Sheet

PROCESS FOR BONDING CONDUCTOR TRACKS TO PLASTICS SURFACES

BACKGROUND OF THE INVENTION

The present invention relates to a process in which surfaces of plastics are provided with electrical conductor tracks with the aid of laser beams.

Moldings made from plastics with integrated electrically conducting layers or tracks are well known, for example from the electrical and electronics industries.

Complicated cable harnesses have hitherto often been utilized for electrical supply to components bearing assemblies and used in the motor vehicle sector, for example, or in household machinery.

Another method is to attach conductor tracks to the plastics surface by hot stamping. In this process, metal foils, for example made from copper, gold or nickel, with thicknesses which are generally from 18 to 150 μm are stamped onto the plastics substrate using a heated block.

There are known processes for bonding plastics by means of laser beams (cf. Ch. Bonten in KU Kunststoffe, 89(8), pp. 33–41 (1999)).

In transmission laser welding, an adherend transparent to the laser light and an adherend which absorbs the laser light are combined and irradiated from the side of the transparent adherend. Absorption of the laser light produces heat which allows the plastics to soften in the irradiated region and thus permits welding.

In laser butt welding, laser light is used by way of a suitable optical system to irradiate at least the adherend which absorbs the laser light, preferably both adherends, and then the adherends are joined at the irradiated sites. Absorption of the laser light produces heat on the surface of the irradiated adherend(s), and this heat permits welded bonding of the two surfaces.

A review of commonly used laser welding processes may be found in the dissertation by J. Korte, "Laserschweißen von Thermoplasten" [Laser welding of thermoplastics], University of Gesarnthochschule Paderborn, January 1998, pp, 1–8.

The processes known hitherto for producing moldings from plastic with integrated conductor tracks are very expensive and require complicated apparatus, and attempts are therefore being made to find alternative methods.

It is an object of the invention to provide a process for providing the surfaces of non-conducting plastics with electrical conductor tracks.

SUMMARY OF THE INVENTION

The process of the invention achieves this object.

The present invention provides a process for bonding conductor tracks to a plastics surface of a molding encompassing the steps of:

a) taking a molding which has at least one plastics surface and which absorbs laser radiation of a prescribed wavelength, b) using laser radiation of a wavelength absorbed by the molding to irradiate those parts of the plastics surface to which the conductor track(s) is/are to be bonded, and c) bringing the conductor track(s) into contact with those sites on the plastics surface which have been heated by the laser radiation.

Another embodiment of the invention provides a process for bonding conductor tracks to a plastics surface of a molding encompassing the steps of:

d) taking a molding which has at least one plastics surface and which absorbs laser radiation of a prescribed wavelength, e) bringing a film made from a plastic which is transparent to the laser radiation of the prescribed wavelength and which has been provided with the conductor track(s) into contact with the plastics surface of the molding f) irradiating the plastic film comprising the conductor track(s) with laser radiation of a wavelength which is absorbed by the molding, so that the plastics surface is heated by the laser radiation and bonds to the plastic film.

Yet another embodiment of the invention provides a process for bonding conductor tracks to a plastics surface of a molding encompassing the steps of:

g) taking a molding which has at least one plastics surface and which does not absorb laser radiation of a prescribed wavelength, h) bringing the conductor track(s) into contact with those sites of the plastics surface to which the conductor track(s) are to be bonded, and i) irradiating the plastics molding with laser radiation of a wavelength which is substantially not absorbed by the molding, from the side opposite to the plastics surface, whereupon the laser radiation is absorbed by the conductor track(s) and the resultant heat bonds the conductor track(s) to the plastics surface.

Yet another embodiment of the invention provides a process for bonding conductor tracks to a plastics surface of a molding encompassing the steps of j) taking a molding which has at least one plastics surface and which does not absorb laser radiation of a prescribed wavelength, k) bringing a film made from a plastic which absorbs laser radiation of the prescribed wavelength and which has been provided with the conductor track(s) into contact with the plastics surface of the molding, l) irradiating the plastic film comprising the conductor track(s) with laser radiation of a wavelength which is absorbed by the plastic film, so that the plastic film is heated by the laser radiation and bonds to the plastics surface of the molding.

Another embodiment of the invention provides a process for producing conductor tracks on the plastics surface of a molding encompassing the steps of:

m) taking a molding which absorbs laser radiation of a prescribed wavelength and which has at least one plastics surface which, at least in the regions close to the surface comprises a filler which promotes metallization, preferably selected from the group consisting of inorganic fillers, in particular inorganic carbonates and inorganic phosphorus compounds, n) irradiating those parts of the plastics surface where conductor tracks are to be produced with laser radiation of a wavelength which is absorbed by the molding, in order to activate the filler which promotes metallization, and o) metallizing the molding in a manner known per se.

The abovementioned processes may use very different types of conductor tracks, for example those in the form of a film comprising conductor tracks or in the form of wires with or without insulation. If uninsulated wires are used, these are generally pressed Into the heated parts of the surface and thus completely embedded into the molding. If the wires used have themselves been embedded in insulating material, these are usually welded to the molding by coming into contact with its heated surface; in this process the wire may be embedded completely into the molding or else merely be bonded to the surface.

The use of fillers which promote metallization is known per se. It is preferable to use fillers selected from the group consisting of inorganic fillers, in particular inorganic carbonates and inorganic phosphorus compounds, very particularly preferably their salts of alkali metals or of alkaline earth metals.

Known processes may be used for metallizing part of the surface of the molding, for example electroplating or vapor deposition. Currentless electro-plating is particularly preferably used for the metallization process.

Examples of moldings bearing conducting structures may be components used in the electrical and electronics industries, or else other large or small plastics parts of any desired shape which have been provided at certain sites with conducting elements.

The molding produced according to the invention may also be a constituent of a composite with other materials.

The process of the invention permits complicated cable harnesses and contacts using plug connectors to be omitted in a wide variety of components, when the conductor structures or components bearing conductor structures are welded onto or embedded into the plastics molding. It is also possible to reduce the high costs incurred and the complicated apparatus needed for hot-stamping of conductor tracks by the present process.

The molding to be provided with conductor tracks may be produced from any desired plastic, preferably from a thermoplastic.

In principle, any thermoplastics may be used for the process of the invention.

Depending on the version of the process, these have to absorb the laser radiation to a sufficient extent or be sufficiently transparent to the laser radiation.

Preferred examples which may be mentioned here are polyacetal homo- and/or copolymers, polyesters, such as polybutylene terephthalate or its copolymers, polyamides, polyolefins, and polyolefin copolymers, e.g. polyethylene and polypropylene.

These plastics may also comprise the usual auxiliaries, additives, fillers and reinforcing agents, as long as there is no resultant significant impairment of the property profile required for laser welding.

It is also possible to use homogeneous and heterogeneous mixtures of plastics. The wavelength and the intensity of the incident laser light are to be matched to the nature of the plastic used. Particular dependent factors are the required irradiation time and therefore the achievable operating speed. Depending on the property profile demanded for the laser welding process, transparent plastics and those without any significant content of absorbing constituents have to have been mixed with additives, such as carbon blacks, fillers, or pigments, which provide sufficient absorption of the laser light.

Examples of transparent plastics are ethylene-norbornene copolymers, polystyrene, polymethyl methacrylate, and other acrylate-based plastics.

In the simplest case, the conductor track may be a metal wire. This may be present as such, in the form of an insulated metal wire, or in the form of a braided wire. However, it is also possible to use prefabricated circuits.

There is no need for any particular restriction on the material. In principle, the conductor tracks may be produced from any electrically conductive material, e.g. of metals, electrically conductive plastics, or graphite.

The conductor track is preferably composed of a metal with good electrical conductivity, e.g. of copper.

The conductor track(s) may be bonded to the plastics surface of the molding as they stand, or together with a molding which bears this/these conductor track(s) in the form of conductive structure on the surface.

This conductive structure is preferably a plastics film and has at least one surface bearing the conductor track(s). Depending on the version selected of the process, the plastics film is to be selected to absorb laser radiation or not absorb laser radiation.

Moldings which are to be bonded to the conductor track (s) may be those which have not hitherto comprised any conducting structure or those previously provided with a conducting structure. For example, they may be conventional printed circuit boards or even populated printed circuit boards, or a plastics film provided with conductor tracks.

The laser sources used are generally the types of laser used for laser welding, for example carbon dioxide lasers, diode lasers, and Nd:YAG (Neodymium-Yttrium-Aluminum-Garnet) lasers.

One version of the process of the invention provides the embedding of the conductor track(s), or of the components bearing the conductor track(s), into the plastics surface to be provided with conductor tracks. In this version, laser radiation is used for local heating of the plastics surface to be provided with conductor tracks, and the conducting structure, or the component bearing a conducting structure, is pressed into the plastics surface.

As an alternative, the conductor track, or the component bearing the conductor track(s), may be heated by the laser and then pressed into the plastics surface.

The process of the invention may be used in a wide variety of industrial sectors, for example in the automotive industry to produce equipment, such as instrument clusters, door locks, or engine controls; or in the electronics industry to manufacture printed circuit boards, for example for producing telecommunications devices, computers, or hi-fi systems.

Figure 1:
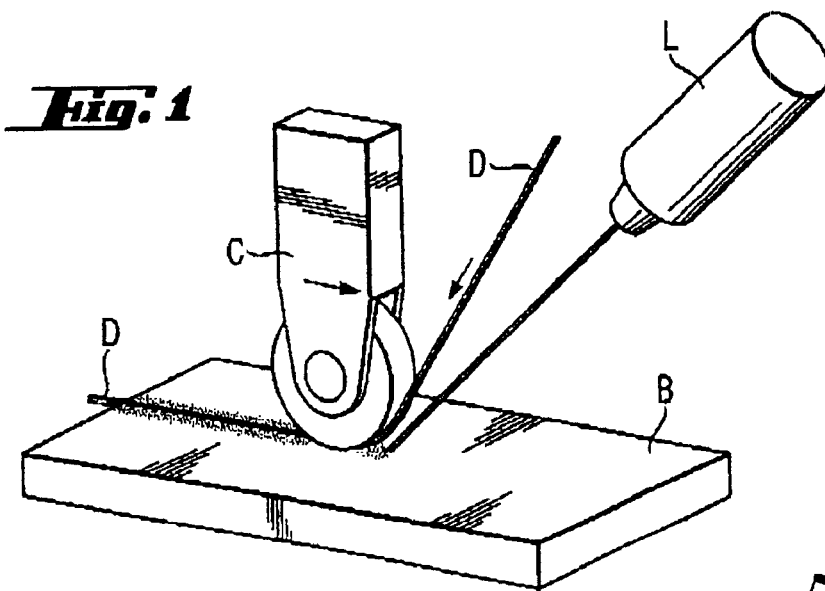
FIG. 1 shows a version of the process in which a conductor track is applied to a plastics surface which has been partially heated in advance.

The laser source (L) illustrated in FIG. 1 locally heats the plastics molding (B) to be provided with a conductor track. A suitable apparatus, e.g. a pressure roller or pressure roll (C) is used to press a conductor track (D) into the locally heated plastics surface.

Preferred conducting structure is a metal wire or a metal conductor structure or a metal circuit. The conducting structure is particularly preferably composed of a wire or a conductor structure made from copper.

DETAILED DESCRIPTION OF THE INVENTION

Figure 2:
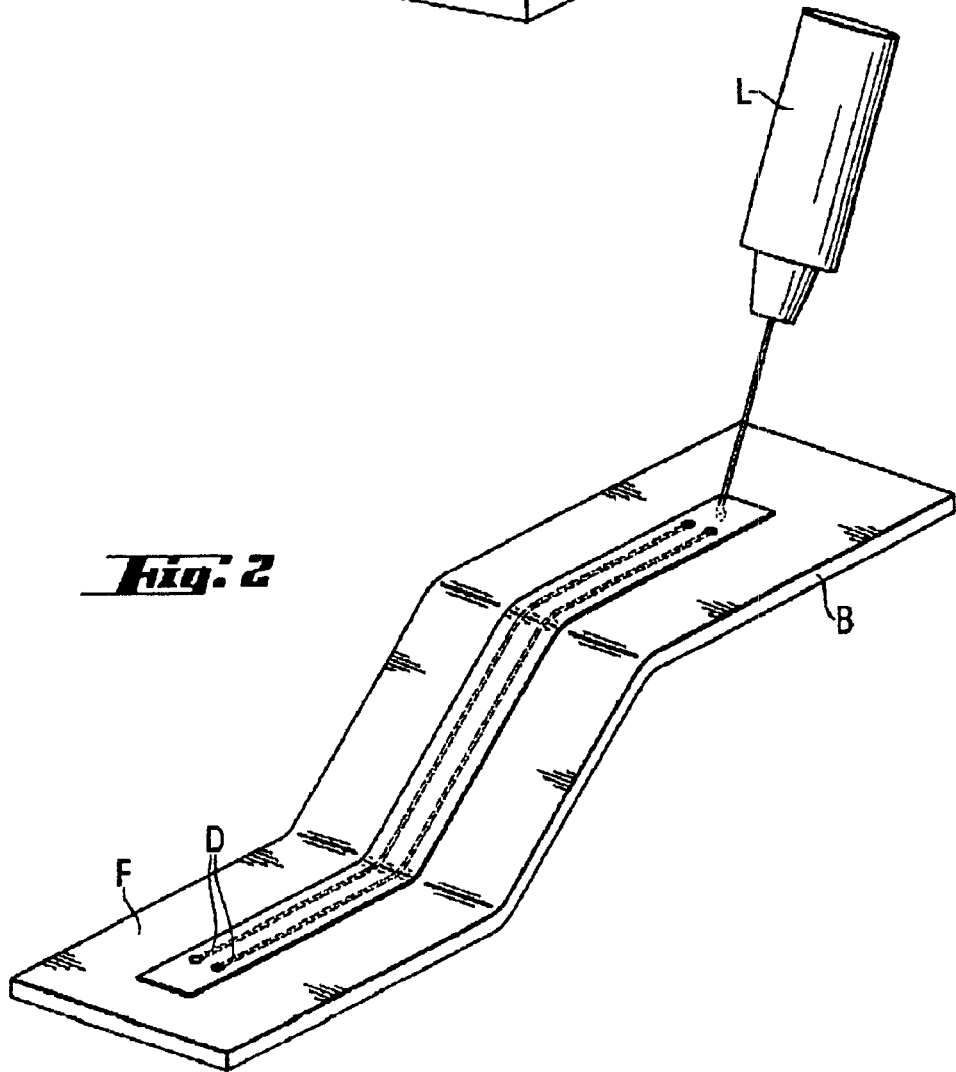
FIG. 2 shows a version of the process in which transmission laser welding is used to bond a conductor track structure located on a plastics film to a plastics surface.

In the version of the process illustrated in FIG. 2 a component which bears a conducting structure is secured by laser welding to a plastic molding to be provided with conductor tracks. The component bearing a conducting structure is preferably composed of a plastics film (F) coated with conductor tracks. This is securely welded to the plastics molding (B) to be provided with conductor tracks by way of transmission laser welding. Here, as illustrated in FIG. 2, a film (F) provided with a conductor track structure (D) transmits a laser beam produced by the laser source (L). Under this, the surface of the plastics molding (B) to be provided with a conductor track is locally heated, resulting in secure welding of the film (F).

What is claimed is:

1. A process for bonding conductor tracks to a plastics surface of a molding encompassing the steps of:
    a) taking a molding which has at least one plastics surface and which absorbs laser radiation of a prescribed wavelength,
    b) using laser radiation of a wavelength absorbed by the moldinq to irradiate those parts of the plastics surface to which the conductor track(s) is/are to be bonded, and
    c) bringing be conductor track(s) into contact with those sites on the plastics surface which have been heated by the laser radiation.

2. The process as claimed in claim 1, wherein the conductor track to be bonded to the plastics surface of the molding has been applied to a plastics film.

3. The process as claimed in claim 1, wherein the conductor track which is to be bonded to the plastics surface of the molding is a metal wire and/or a prefabricated circuit.

4. The process as claimed in claim 1, wherein the conductor track which is to be bonded to the plastics surface of the molding is a metal wire and/or a prefabricated circuit, and wherein the metal wire is an uninsulated metal wire and/or an insulated metal wire, and/or a braided wire.

5. The process as claimed in claim 1, wherein the molding is composed of at least one thermoplastic.

6. The process as claimed in claim 1, wherein the molding is composed of at least one thermoplastic selected from the group consisting of polyacetal homo- and/or copolymers, polyesters, polyarrildes, polyolefins, polyolefin copolymers, and mixtures of these.

7. The process as claimed in claim 1, wherein a laser source (L) is used for local heating of a plastics molding (B) to be provided with a conductor track, and a conductor track (D) is pressed into the locally heated plastics surface by means of a pressure roller or pressure roll (C).

* * * * *

UNITED STATES PATENT AND TRADEMARK OFFICE
CERTIFICATE OF CORRECTION

PATENT NO. : 6,881,291 B2
DATED : April 19, 2005
INVENTOR(S) : Reinhold Platz

It is certified that error appears in the above-identified patent and that said Letters Patent is hereby corrected as shown below:

Column 5,
Line 14, delete "moldinq" and insert -- molding --.

Column 6,
Line 14, delete "polyarrildes" and insert -- polyamides --.

Signed and Sealed this

Eleventh Day of October, 2005

JON W. DUDAS
*Director of the United States Patent and Trademark Office*